United States Patent
Lee et al.

(10) Patent No.: US 9,892,963 B2
(45) Date of Patent: Feb. 13, 2018

(54) DEVICE AND METHOD FOR REDUCING CONTACT RESISTANCE OF A METAL

(71) Applicant: Taiwan Semiconductor Manufacturing Company, Ltd., Hsin-Chu (TW)

(72) Inventors: Ya-Lien Lee, Hsinchu County (TW); Hung-Wen Su, Hsinchu County (TW); Kuei-Pin Lee, New Taipei (TW); Yu-Hung Lin, Taichung (TW); Yu-Min Chang, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/879,992

(22) Filed: Oct. 9, 2015

(65) Prior Publication Data
US 2016/0111327 A1    Apr. 21, 2016

Related U.S. Application Data

(60) Division of application No. 14/286,859, filed on May 23, 2014, now Pat. No. 9,159,666, which is a (Continued)

(51) Int. Cl.
*H01L 21/78* (2006.01)
*H01L 21/768* (2006.01)
(Continued)

(52) U.S. Cl.
CPC .. *H01L 21/76843* (2013.01); *H01L 21/76802* (2013.01); *H01L 21/76829* (2013.01); *H01L 21/76879* (2013.01); *H01L 23/50* (2013.01); *H01L 23/53238* (2013.01); *H01L 21/2855* (2013.01); *H01L 21/28562* (2013.01); (Continued)

(58) Field of Classification Search
CPC .......... H01L 21/7841; H01L 23/53223; H01L 23/53238; H01L 29/4941; H01L 33/0037; H01L 41/0815; H01L 28/75; H01L 29/4933; H01L 23/50; H01L 21/2855
See application file for complete search history.

(56) References Cited

U.S. PATENT DOCUMENTS 5,893,752 A    4/1999  Zhang et al.
6,952,052 B1 *  10/2005  Marathe ............ H01L 21/76846
                                                    257/750
(Continued)

FOREIGN PATENT DOCUMENTS

CN    103579187 A    2/2014
KR    20090045677 A    7/2009

*Primary Examiner* — Whitney T Moore
(74) *Attorney, Agent, or Firm* — Haynes and Boone, LLP

(57) ABSTRACT

A method of fabricating an integrated circuit includes depositing a cap layer on a substrate; depositing a dielectric layer on the cap layer; and forming a trench in the dielectric layer. The method further includes depositing a tantalum nitride (TaN) layer on a sidewall of the trench such that the TaN layer has a greater concentration of nitrogen than tantalum. The method further includes depositing a tantalum (Ta) layer on the TaN layer using physical vapor deposition (PVD); and depositing a metal layer over the Ta layer.

20 Claims, 13 Drawing Sheets

Related U.S. Application Data continuation-in-part of application No. 13/601,223, filed on Aug. 31, 2012, now Pat. No. 8,736,056.

(60) Provisional application No. 61/677,862, filed on Jul. 31, 2012.

(51) Int. Cl.
    *H01L 23/50*    (2006.01)
    *H01L 23/532*    (2006.01)
    *H01L 21/285*    (2006.01)

(52) U.S. Cl.
    CPC .. *H01L 21/76807* (2013.01); *H01L 23/53295* (2013.01); *H01L 2924/0002* (2013.01)

(56) References Cited

U.S. PATENT DOCUMENTS

| | | | |
|---|---|---|---|
| 6,986,914 | B2 | 1/2006 | Elers et al. |
| 7,098,537 | B2 | 8/2006 | Cabral, Jr. et al. |
| 7,202,162 | B2 | 4/2007 | Lin et al. |
| 7,741,216 | B2 | 6/2010 | Kim et al. |
| 8,736,056 | B2 | 5/2014 | Lee et al. |
| 8,778,801 | B2 | 7/2014 | Chiang et al. |
| 2005/0245072 | A1 | 11/2005 | Lee et al. |
| 2005/0269703 | A1* | 12/2005 | Dunn ............... H01L 21/28562 257/751 |
| 2005/0277292 | A1* | 12/2005 | Peng ................ H01L 21/28562 438/672 |
| 2006/0009030 | A1* | 1/2006 | Griffin, Jr. ........ H01L 21/02063 438/637 |
| 2006/0113675 | A1* | 6/2006 | Chang ............... H01L 21/76814 257/763 |
| 2006/0118962 | A1 | 6/2006 | Huang et al. |
| 2006/0148253 | A1* | 7/2006 | Chung ..................... C23C 16/34 438/681 |
| 2006/0202346 | A1 | 9/2006 | Shih et al. |
| 2007/0045724 | A1 | 3/2007 | Lim et al. |
| 2007/0190341 | A1* | 8/2007 | Furuya ..................... C25D 3/38 428/446 |
| 2007/0196341 | A1* | 8/2007 | Uchida ................ A23C 21/026 424/93.4 |
| 2008/0006905 | A1 | 1/2008 | Barth et al. |
| 2008/0081464 | A1 | 4/2008 | Matsuda et al. |
| 2009/0116169 | A1* | 5/2009 | Tsao ........................ H01G 4/008 361/311 |
| 2009/0236744 | A1* | 9/2009 | Kinoshita ........... H01L 21/2855 257/751 |
| 2010/0230815 | A1 | 9/2010 | Tsao et al. |
| 2011/0227224 | A1 | 9/2011 | Kitao et al. |
| 2012/0097916 | A1 | 4/2012 | Tada et al. |
| 2012/0139115 | A1 | 6/2012 | You et al. |
| 2012/0269987 | A1 | 10/2012 | Dordi et al. |
| 2013/0127055 | A1 | 5/2013 | Chen et al. |
| 2013/0264620 | A1* | 10/2013 | Yu ..................... H01L 23/53238 257/295 |
| 2014/0117547 | A1 | 5/2014 | Lin et al. |
| 2014/0264872 | A1 | 9/2014 | Lin et al. |

* cited by examiner

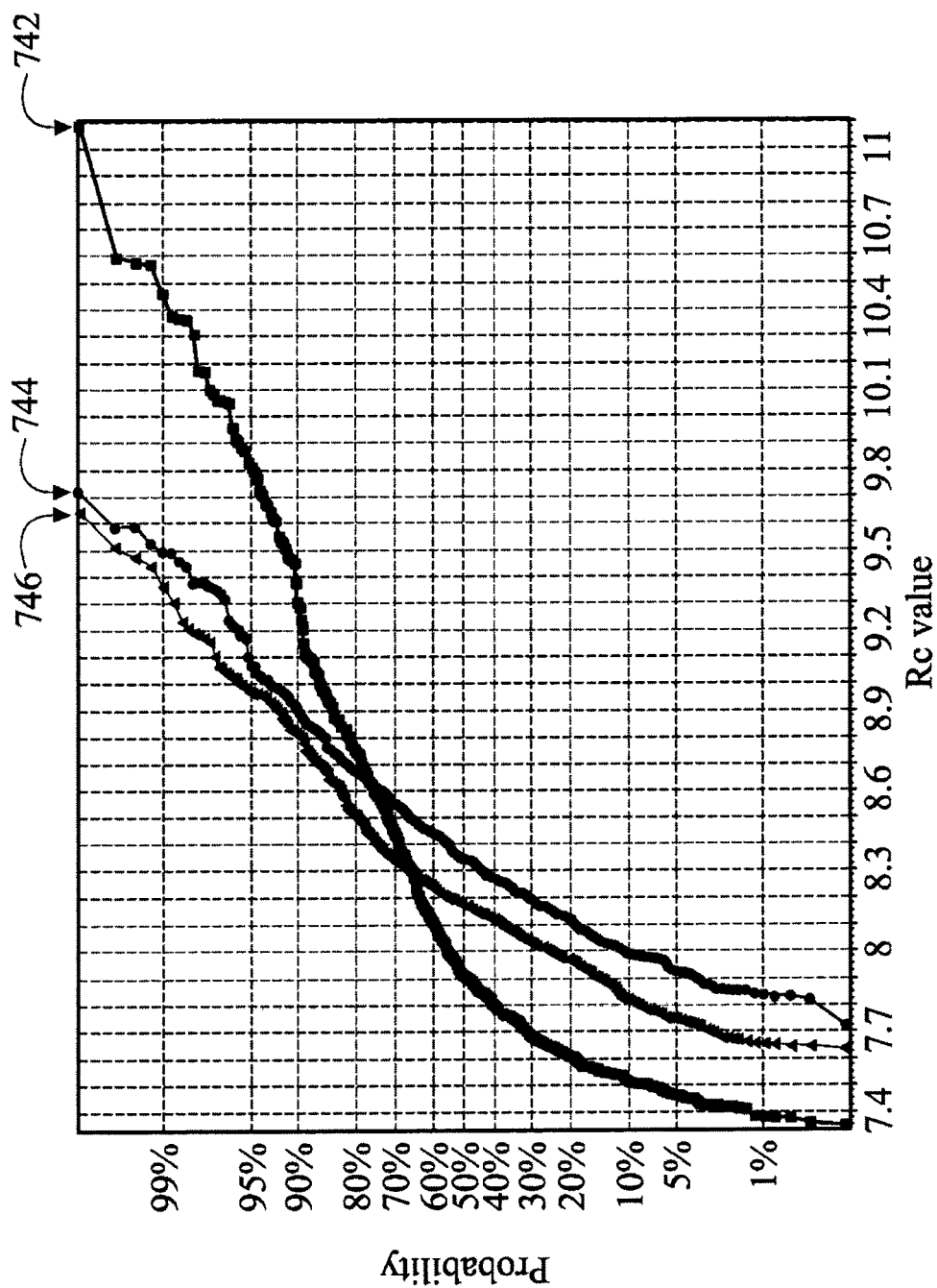

DEVICE AND METHOD FOR REDUCING CONTACT RESISTANCE OF A METAL

PRIORITY DATA

This is a divisional application of U.S. patent application Ser. No. 14/286,859 entitled "Device and Method for Reducing Contact Resistance of a Metal" filed on May 23, 2014, which is a continuation-in-part of U.S. patent application Ser. No. 13/601,223 filed on Aug. 31, 2012, now issued U.S. Pat. No. 8,736,056, which in turn claims priority to U.S. Provisional Patent Application Ser. No. 61/677,862 filed on Jul. 31, 2012 and entitled "A Method of Reducing Contact Resistance of a Metal." The entire disclosure of the above applications is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

For example, as the critical dimension (CD) of devices are scaled down, any variations in the CD may become more relevant, including resulting variations in the contact resistance (Rc) of a metal structure in an IC device. Accordingly, what is needed is a method for further scaling down of the IC device.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

FIGS. 21 and 22 show graphs of contact resistance of the devices of FIG. 14 and FIG. 18, in accordance with some embodiments.

DETAILED DESCRIPTION

Figure 1:
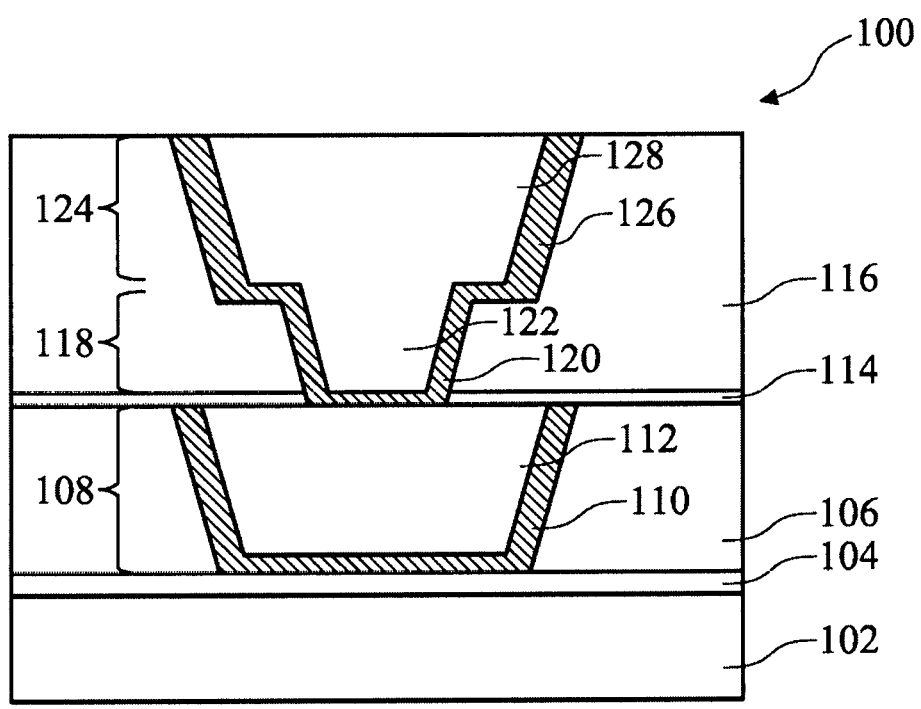
FIG. 1 is a cross sectional view of a device according to one or more embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For the sake of comparison, the following disclosure describes three different devices. A first device 100 is described with reference to FIG. 1, and represents a method and device that utilizes physical vapor deposition (PVD) of materials such as tantalum (Ta) and tantalum nitride (TaN) for the deposition of barrier layers inside one or more trenches. A second device 300 is described with reference to FIGS. 2-14, and represents a method and device that utilizes different deposition techniques, such as PVD, atomic layer deposition (ALD), and/or chemical vapor deposition (CVD) for the deposition of barrier layers inside one or more trenches. A third device 600 is described with reference to FIG. 18, and represents a method and device that utilizes physical vapor deposition (PVD) of materials such as tantalum (Ta) and tantalum nitride (TaN) for the deposition of barrier layers inside one or more trenches. The differences among them will be discussed where appropriate.

Referring to FIG. 1, the device 100 includes a substrate 102, a first cap layer 104 deposited on the substrate 102, a first dielectric layer 106 deposited on the first cap layer 104, a first trench 108 embedded into the first dielectric layer 106, a second cap layer 114 deposited over the first trench 108 and the first dielectric layer 106, a second dielectric layer 116 deposited on the second cap layer 114, a via 118 formed on the first trench 108 and buried in the second dielectric layer 116, a second trench 124 formed on the via 118 and buried in the second dielectric layer 116.

The first trench 108 is embedded into the first dielectric layer 106. The first trench 108 includes a first trench metal barrier layer 110 deposited on bottom and side walls of the first trench 108 and a first trench metal 112 filled into the first trench 108 over the first trench metal barrier layer 110. For the sake of reference, a trench metal is also referred to as a metal and a trench metal barrier layer is also referred to as a metal barrier layer.

The first trench metal barrier layer 110, the via metal barrier layer 120, and the second trench barrier metal layer 126 include a PVD TaN layer and a PVD Ta layer. A contact resistance (Rc) of the first trench metal 112 or the second trench metal 128 (or 122) using the PVD TaN and PVD Ta as a metal barrier layer depends on a critical dimension (CD) of the first trench metal 112 and/or the second trench metal 128. The contact resistance (Rc) increases with the CD of the corresponding trench metal. Accordingly, a variation of a contact resistance (Rc) of a trench metal in the IC may significantly impact the performance of the IC.

FIGS. 2-14 describe the second device 300 that provides a lower Rc than the first device 100 of FIG. 1, with little or no impact on metal line resistivity and back end of line (BEOL) reliability.

Figure 2:
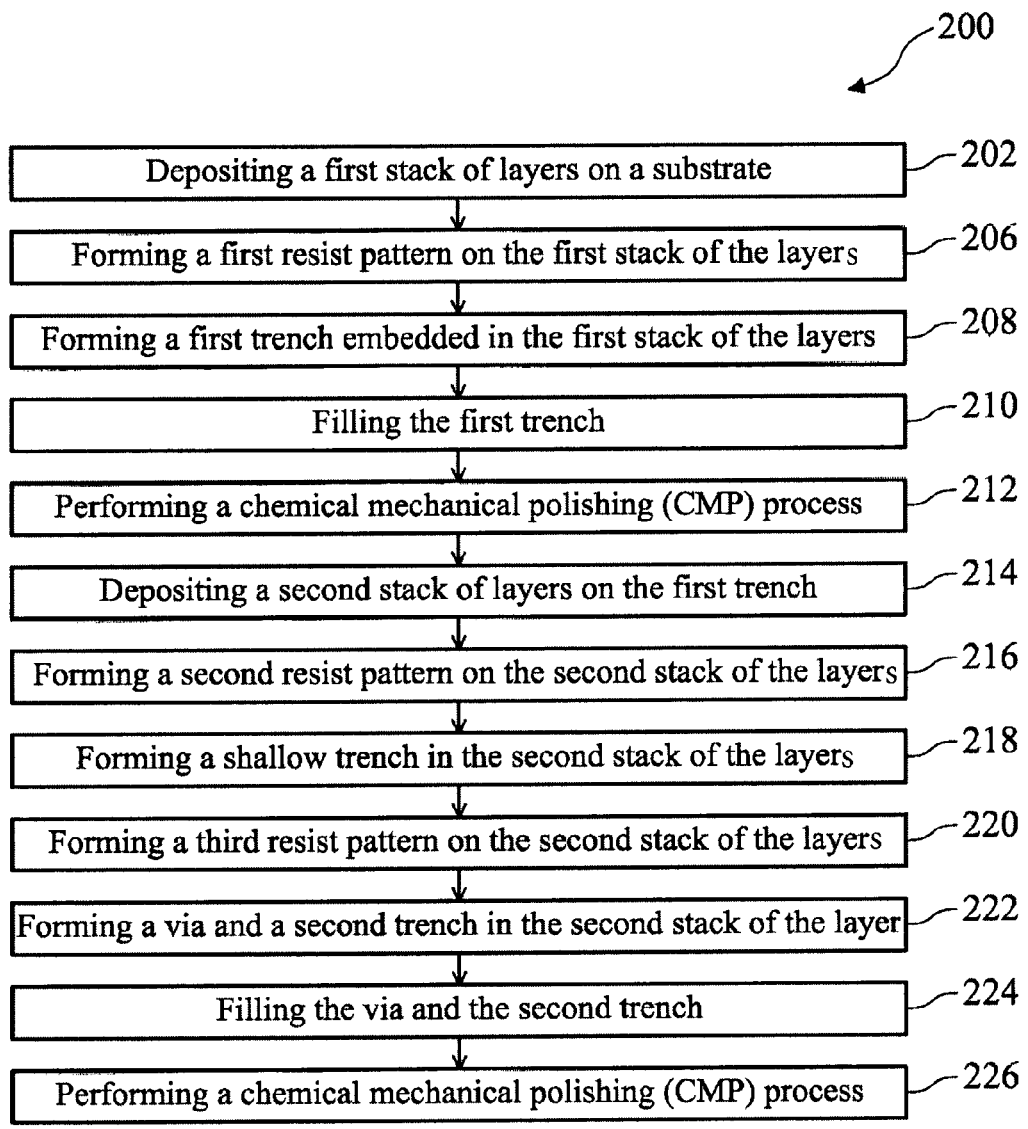
FIG. 2 is a flow chart of a method of fabricating a device for implementing one or more embodiments of the present disclosure.

Referring to FIG. 2, a method 200 of forming the device 300 is illustrated for implementing one or more embodiments of the present disclosure. FIGS. 3-14 are cross sectional views of the second device 300 formed using the method 200.

Figure 3:
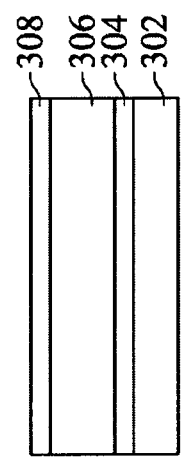

The method 200 begins at step 202 by forming a stack of layers on a substrate 302 as shown in FIG. 3. Step 202 includes depositing a first cap layer 304 on the substrate 302, depositing a first dielectric layer 306 on the cap layer 304, and depositing a hard mask layer 308 on the first dielectric layer 306.

In the present embodiments, the substrate 302 includes a wafer with or without one or more conductive or non-conductive thin films. The wafer is a semiconductor substrate including silicon (in other words, a silicon wafer). Alternatively or additionally, the wafer may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP. In yet another alternative, the wafer may be a semiconductor-on-insulator (SOI). The conductive and non-conductive thin films may comprise an insulator or a conductive material. For example, the conductive material comprises a metal such as aluminum (Al), copper (Cu), tungsten (W), nickel (Ni), titanium (Ti), gold (Au), and platinum (Pt) and, thereof an alloy of the metals. The insulator material may include silicon oxide and silicon nitride.

The substrate 302 may include various doped features, such as n-type source/drain, p-type source/drain, n-type wells, and/or p-type wells, formed by ion implantation or diffusion. The substrate 302 may also include various isolation features, such as shallow trench isolation (STI), formed by a process, such as a process including etching to form various trenches and then depositing to fill the trench with a dielectric material. The substrate 302 further includes a gate and a contact hole formed in a front end of line (FEOL) for fabricating a semiconductor IC device.

In some embodiments, the first cap layer 304 includes silicon nitride ($Si_xN_y$). The first cap layer 304 is used to prevent metal (e.g. copper) diffusion. The first dielectric layer 306 includes a dielectric material, which may be organic or inorganic. In the present embodiment, the dielectric material includes an organic silicone gel (OSG) with a dielectric constant k that ranges from about 2.6 to about 2.65. The low k dielectric material OSG is formed by a chemical reaction between precursors, such as diethoxy methyl silane (DEMS), and a porogen, such as α-Terpinene (ATRP) under oxygen ($O_2$) plasma following by an ultra-violet (UV) cure. The first dielectric layer 306 may include silicon (Si), carbon (C), oxygen ($O_2$), and hydrogen (H). The first hard mask layer 308 includes materials such as silicon nitride ($Si_xN_y$) or a metal hard mask such as Ti or TiN. Other suitable materials are possible for the first cap layer 304, the first dielectric layer 306, and the first hard mask layer 308.

Figure 4:
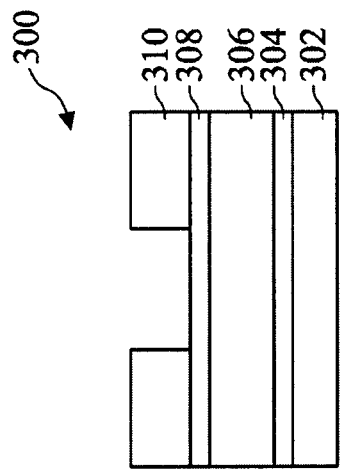
FIGS. 3, 4, 5, 6, 7, 8, 9, 10, 11, 12, 13, and 14 are cross sectional views of forming a device for implementing one or more embodiments of the present disclosure.

The method 200 proceeds to step 206 by forming a first photo resist pattern 310. As shown in FIG. 4, the first photo resist pattern 310 is formed on top of the first hard mask layer 308 deposited on the first dielectric layer 306. Step 206 includes depositing a first photo resist film on the first hard mask layer 308, for example, by a spin-on coating process. In the present disclosure, a photo resist film is also referred to as a resist film. The first photo resist film may include a positive tone resist or a negative tone resist. The first photo resist film may also include a single photo resist film or a multiple layer photo resist films. Step 206 may include performing a dehydration process before depositing the first photo resist film on the hard mask layer 308, which can enhance an adhesion of a photo resist film to the hard mask layer 308. The dehydration process may include a high temperature baking for a duration of time, or applying a chemical such as hexamethyldisilizane (HMDS) to the hard mask layer 308. Step 206 also includes applying a bottom anti-reflection coating (BARC) process to improve profile of a photo resist pattern. Step 206 includes using a soft bake (SB) process to increase a mechanical strength of the photo resist film.

Step 206 further includes exposing the first photo resist film deposited on the mask layer 308 using a lithography exposing tool. The lithography exposing tool includes an ultraviolet (UV) light, a deep ultraviolet (DUV) light, an extreme ultraviolet (EUV), or a X-ray light tool. The lithography exposing tool also includes a charged particle tool, such as an electron beam writer. Step 206 may also include using a mask, such as a binary mask or a phase shift mask (PSM). The phase shift mask may be an alternative phase shift mask (alt. PSM) or an attenuated phase shift mask (att. PSM). In the present disclosure, a mask is also referred to as a photomask or a reticle.

Step 206 also includes developing the exposed first photo resist film using a developer, such as tetramethylammonium hydroxide (TMAH). It is possible to use an organic solvent as a developer. Step 206 also includes a post exposure bake (PEB), a post develop bake (PDB), or both. Step 206 also includes a rinsing process to remove any developing residue.

Figure 5:
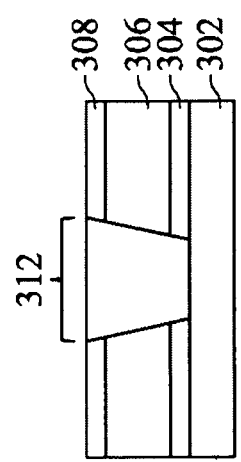

The method 200 proceeds to step 208 by forming a first trench 312 as shown in FIG. 5. Step 208 includes removing a portion of the hard mask layer 308 not covered the first photo resist pattern 310 by using an etching process. Step 208 also includes using a cleaning process to strip the first photo resist pattern 310 and remove any etching residue. Step 208 further includes forming the first trench 312 using an etching process. The first trench 312 penetrates the first dielectric layer 306 and the first cap layer 304 to reach a contact area of the substrate 302, such as a gate, a source, a drain, or a capacitor embedded into the substrate 302.

Figure 6:
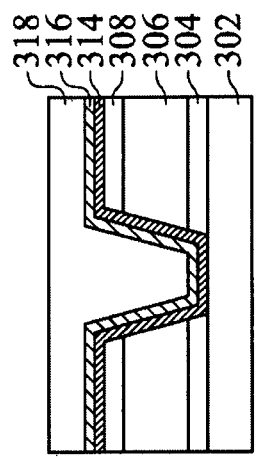

The method 200 proceeds to step 210 by filling the first trench 312 using conductive material. Step 210 includes depositing a metal barrier on bottom and side walls of the first trench 312. In the present embodiments, the metal barrier includes multiple layers, formed using more than one deposition process. Step 210 includes depositing a first barrier layer 314 on the bottom and the side walls of the first trench 312 as shown in FIG. 6 using atomic layer deposition (ALD) process or chemical vapor deposition (CVD). Step 210 also includes depositing a second barrier layer 316 on the first barrier layer 314 using a deposition process, such as a PVD process. In one embodiment, the second barrier layer 316 includes only a PVD Ta layer without a PVD TaN layer. In another embodiment, the second barrier layer 316 includes a PVD Ta layer with a PVD TaN layer. Both of these embodiments include PVD Ta, but the PVD TaN is optional. It is understood that it is possible to add more barrier layers. It is noted that a TaN layer formed by an ALD process is referred to as ALD TaN, a TaN layer formed by a CVD process is referred to as CVD TaN, a Ta layer formed by a PVD process is referred as PVD Ta, and so forth. It is further noted that PVD TaN is different from ALD TaN or CVD TaN, as discussed below.

Step 210 further includes filling the first trench 312 with a first trench metal 318, such as copper (Cu), as shown in FIG. 6 using a deposition process, such as an electroplating process. In one embodiment, step 210 may also include depositing a seed layer.

Figure 7:
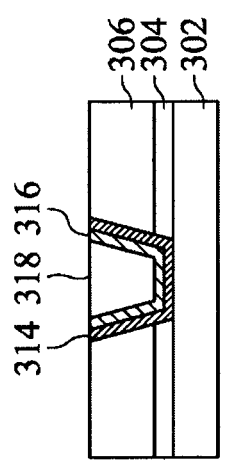

The method 200 proceeds to step 212 by performing a chemical mechanical polishing (CMP) process. Step 212 includes removing the first trench metal 318, the second barrier layer 316, and the first barrier layer 314 outside the first trench 312 as shown in FIGS. 6-7. Step 212 also includes removing the first hard mask layer 308 using an etching process. Step 212 further includes using a pad and slurry for polishing. Step 212 also includes using a scrub cleaning process. As shown in FIG. 7, the first trench metal 318 is embedded in the first dielectric layer 306.

Figure 8:
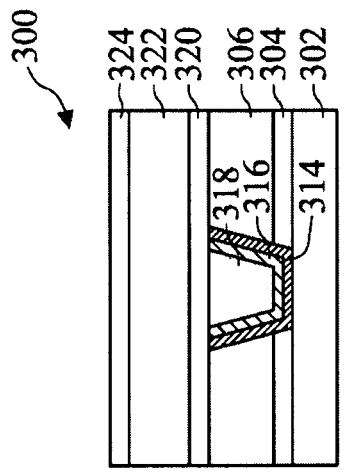

The method 200 proceeds to step 214 by depositing a second stack of layers on the first trench metal 318 embedded in the first dielectric layer 306 as shown in FIG. 8. Step 214 includes depositing a second cap layer 320 on the first trench metal 318 embedded in the first dielectric layer 306, depositing a second dielectric layer 322 on the second cap layer 320 deposited on the first trench metal 318, and depositing a second hard mask layer 324 on the second dielectric layer 322 deposited on the second cap layer 320.

As shown in FIG. 8, in the present embodiment, the second cap layer 320 includes silicon nitride ($Si_xN_y$). The second cap layer 320 is used to prevent metal (e.g. copper) diffusion between metal layers. The second dielectric layer 322 may include organic or inorganic dielectric material. In the present embodiment, the material includes organic silicone gel (OSG) with a dielectric constant k ranging from about 2.6 to about 2.65. The low k dielectric OSG material is formed by a chemical reaction between a precursor, such as diethoxy methyl silane (DEMS), and a porogen, such as α-Terpinene (ATRP) under oxygen ($O_2$) plasma following by an ultraviolet (UV) cure. The second dielectric layer 322 may include silicon (Si), carbon (C), oxygen ($O_2$), and/or hydrogen (H). The second dielectric layer 322 may be the same or similar to the first dielectric layer 306. The second hard mask layer 324 includes materials such as silicon nitride ($Si_xN_y$) or a metal hard mark like Ti or TiN. Other suitable materials are possible for the second cap layer 320, the second dielectric layer 322, and the second hard mask layer 324.

Figure 9:
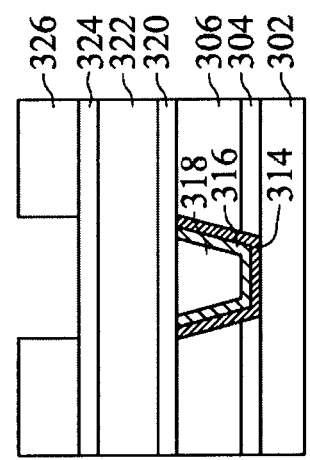

The method 200 proceeds to step 216 by forming a second photo resist pattern 326 as shown in FIG. 9. The second photo resist pattern 326 is formed on top of the second hard mask layer 324 deposited on the second dielectric layer 322. Step 216 is similar or the same as step 206 when forming the first photo resist pattern 310 with reference to FIG. 4.

Figure 10:
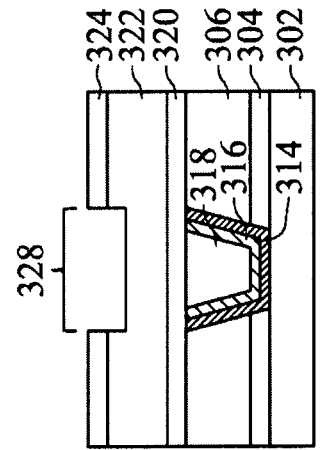

The method 200 proceeds to step 218 by forming a trench 328 as shown in FIG. 10. Step 218 includes removing a portion of the second hard mask layer 324 not covered by the second photo resist pattern 326 using an etching process. Step 218 also includes etching into the second dielectric layer 322 as shown in FIG. 10. Step 218 further includes using a cleaning process to strip the second photo resist pattern 326 and remove an etching residue.

Figure 11:
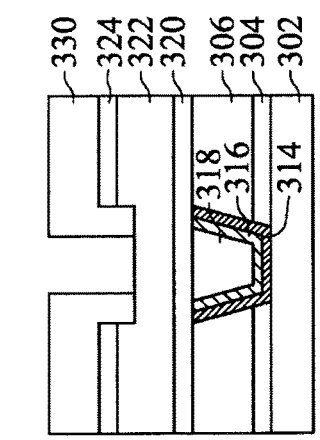

The method 200 proceeds to step 220 by forming a third photo resist pattern 330 as shown in FIG. 11. The third photo resist pattern 330 is formed on top of the trench 328 and the second hard mask layer 324. Step 220 is similar or the same as step 206 when forming the first photo resist pattern 310 with reference to FIG. 4.

Figure 12:
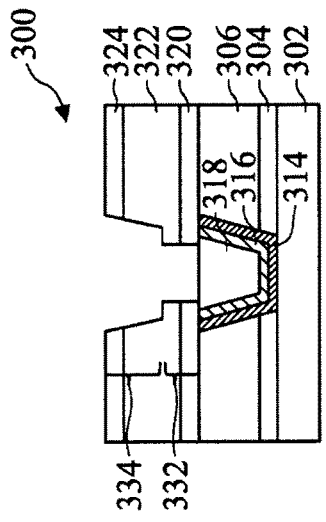

The method 200 proceeds to step 222 by forming a via 332 and a second trench 334 as shown in FIG. 12. Step 222 includes etching through the second dielectric layer 322 and the second cap layer 320 to reach the first trench metal 318 by utilizing the third photo resist pattern 330 and an etching process. Step 222 also includes stripping the third photo resist pattern 330 using a cleaning process. Step 222 further includes etching the second dielectric layer 322 by utilizing the hard mask layer 324 using an etching process.

Figure 13:
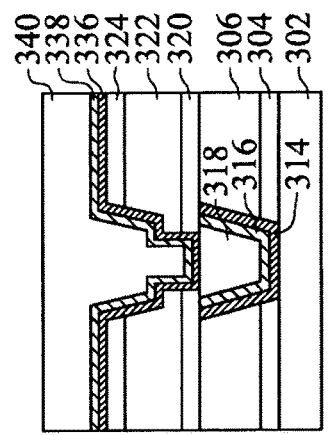

The method 200 proceeds to step 224 by filling the via 332 and the second trench 334 as shown in FIG. 13. Step 224 includes depositing a third barrier layer 336 on bottom and side wall of the via 332 and second trench 334 using ALD or CVD. In the present embodiment, the third barrier layer 336 contacts the first trench metal 318. Step 224 also includes depositing a fourth barrier layer 338 on the third barrier layer 336 using a deposition process, such as PVD. Step 224 further includes depositing a second trench metal 340 on the fourth trench barrier layer 338 and filling up the via 332 and the second trench 334 using a deposition process, such as an electroplating process. In one embodiment, step 224 may also include depositing a seed layer of the second trench metal.

In the present embodiment, the third barrier layer 336 includes a TaN layer deposited on the bottom and the side walls of the via 332 and the second trench 334 using an ALD process or a CVD process (ALD TaN or CVD TaN). In one embodiment, the fourth barrier layer 338 includes only PVD Ta, without PVD TaN. In another embodiment, the fourth barrier layer 338 includes PVD Ta with PVD TaN. Continuing with the present embodiments, the second trench metal 340 includes a copper (Cu) formed by using an electroplating process. The second trench metal 340 may include other metal or metal alloy.

Figure 14:
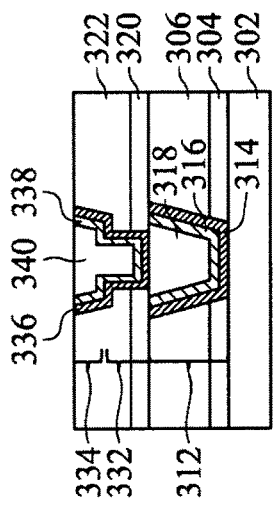

The method 200 proceeds to step 226 by performing a chemical mechanical polishing (CMP) process. Step 226 includes removing the third barrier layer 336, the fourth barrier layer 338, and the second trench metal 340 outside the second trench 332 as shown in FIGS. 13-14. Step 226 includes using a pad and slurry for polishing. Step 226 also includes using a scrub cleaning process. Step 226 further includes removing the second hard mask layer 324 using an etching process. Additional steps can be provided before, during, and after the method 200, and some steps described can be replaced, eliminated, or moved around for additional embodiments of the method 200. In the presented embodiments, more trench metal layers can be formed by using the method 200.

As shown in FIG. 14, the device 300 fabricated by the method 200 includes the substrate 302, the first cap layer 304 deposited on the substrate 302, the first dielectric layer 306 deposited on the first cap layer 304, the first trench 312 embedded into the first cap layer 304 and the first dielectric layer 306, the second cap layer 320 deposited on the first dielectric layer 306, the second dielectric layer 322 deposited on the second cap layer 320, the via 332 integrated on top of the first trench 312 and embedded into the second cap layer 320 and the second dielectric layer 322, and the second trench 334 integrated on top of the via 332 and embedded into the second dialect layer 322. However, other configurations of the device are possible.

As shown in FIG. 14, the first trench 312 includes a first barrier layer 314 deposited on the bottom and the side walls of the first trench 312, the second barrier layer 316 deposited on the first barrier layer 314, and the first trench metal 318 deposited on the second barrier layer 316 while filling up the first trench 312. The via 332 includes a third barrier layer 336 deposited on the top of the first trench metal 318 and the side walls of the via 332, the fourth barrier layer 338 deposited on the third barrier layer 336, and the second trench metal 340 deposited on the fourth barrier layer 338 while filling up the via 332. The second trench 334 includes a third barrier layer 336 deposited on the side wall of the second trench 334, the fourth barrier layer 338 deposited on the third barrier layer 336, and the second trench metal 318 deposited on the fourth barrier layer 338 while filling up the second trench 334. The via 332 is integrated with the second trench 334. The third barrier layer 336 and the fourth barrier layer 338 are shared by both the via 332 and the second trench 334. Both the via 332 and the second trench 334 are filled with the second trench metal 340.

Figure 15:
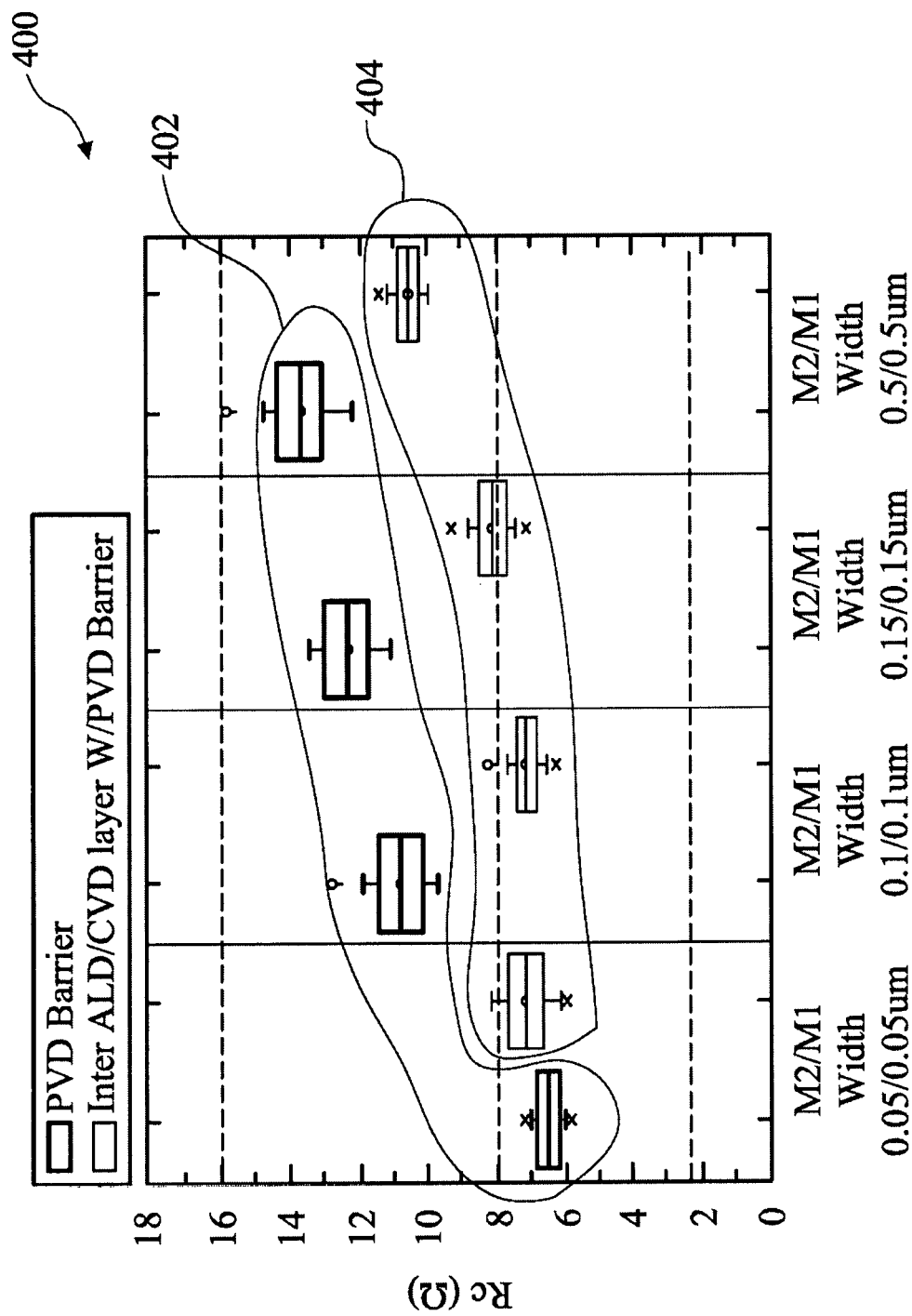
FIG. 15 is an example of a contact resistance improvement for the devices of FIG. 1 and FIGS. 3-14.

FIG. 15 is a graph 400 that compares the Rc of the device 100 (FIG. 1), identified with the group 402, with the Rc of the device 300 (FIGS. 2-14), identified with the group 404. The group 402 includes Rc data between a first trench metal M1 and a second trench metal M2 with a critical dimension (CD) changing of the M1 and the M2 while the M1 and M2 are deposited on a PVD Ta/TaN. The group 404 includes Rc data between a first trench metal M1 and a second trench metal M2 with a CD changing of the M1 and the M2 while the M1 and M2 are deposited on an ALD TaN/PVD Ta.

The Rc data in group 404 is lower than the Rc data in group 402 at different M1/M2 CDs, with only one exception for M1/M2 at 0.05 µm in which they are about the same. As shown in the figure, the Rc in group 402 changes from about 6 to about 14Ω, while the RC in group 404 changes from about 6 to about 11Ω. It is noted that variations of the Rc data in the group 404 are smaller than variations of the Rc data in the group 402 at different M1/M2 CD locations. It is further noted that the slope of the Rc change in the group 404 is shallower than a slope of the RC change in the group 402. Therefore, performance of an IC device is improved by using device 300, as compared to device 100.

Figure 16:
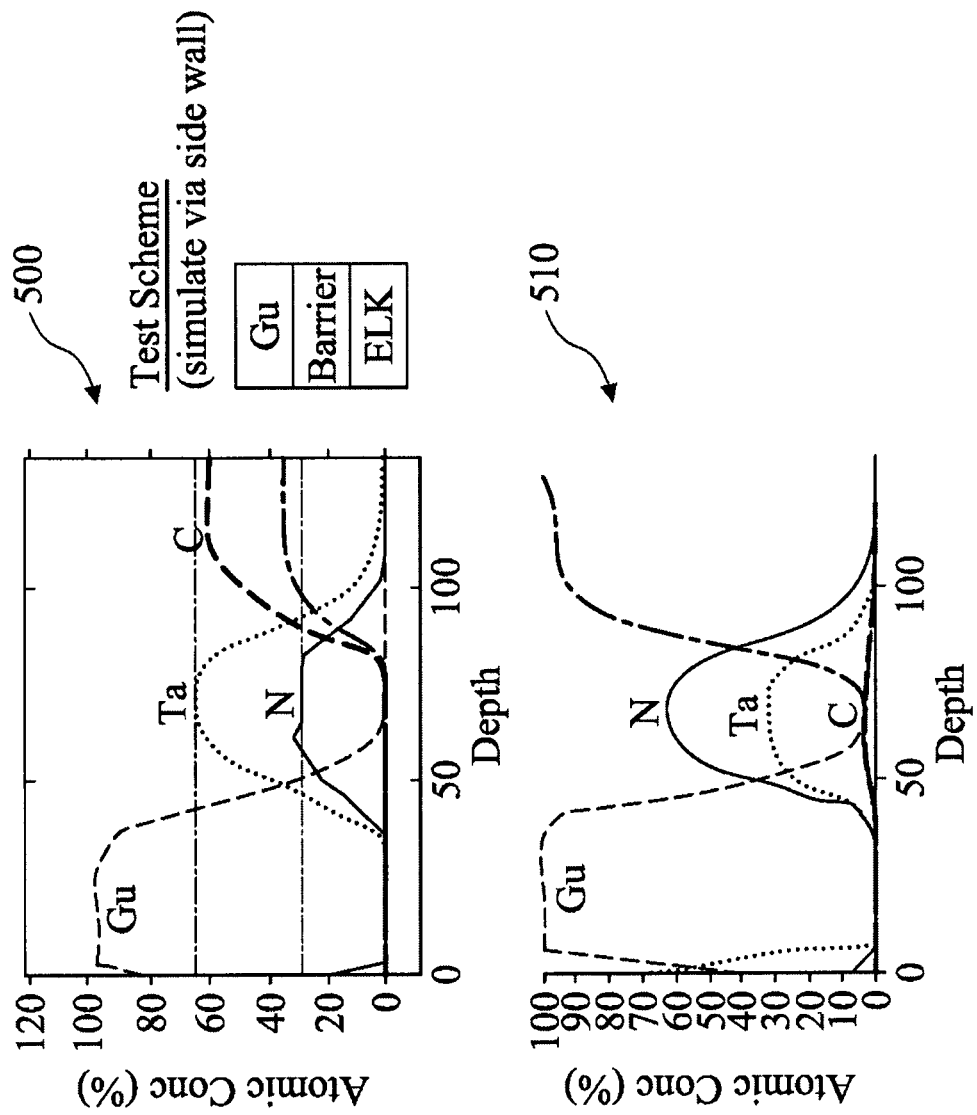
FIG. 16 provides graphs of different element ratios for the devices of FIG. 1 and FIGS. 3-14.
Figure 17:
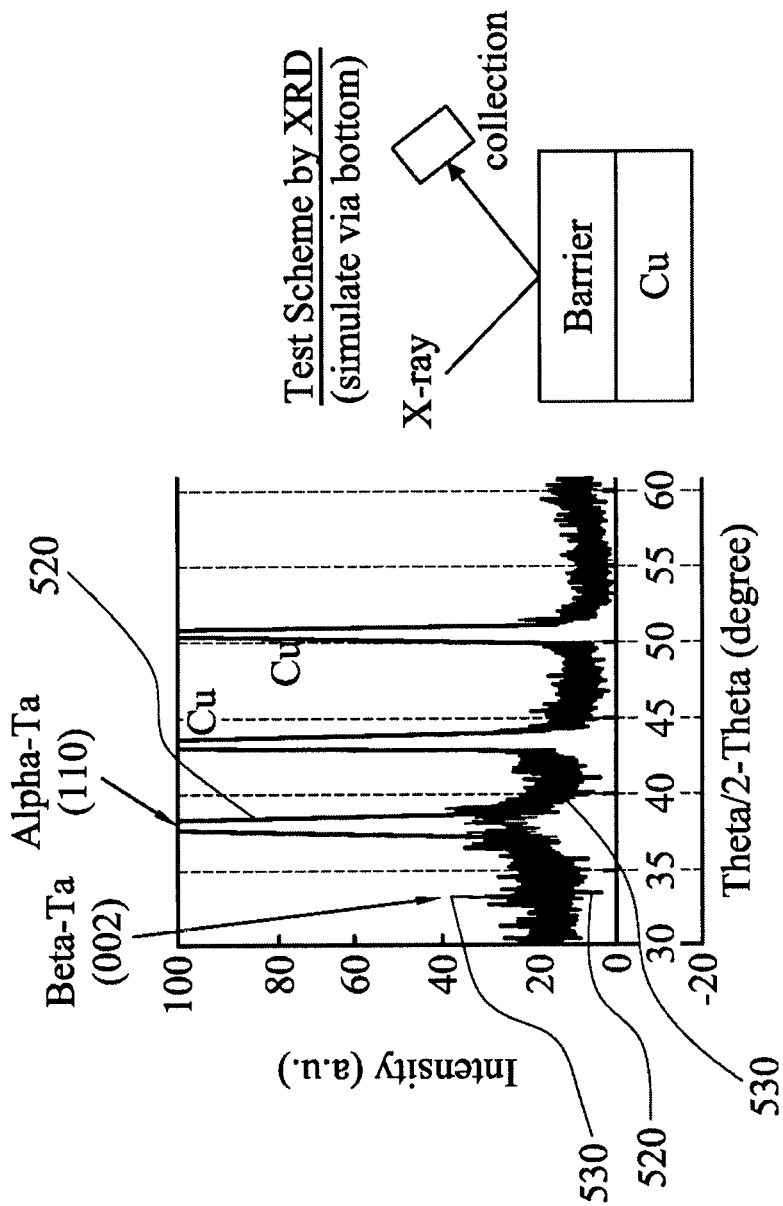
FIG. 17 is an X-ray diffraction (XRD) analysis of two TaN compounds for the devices of FIG. 1 and FIGS. 3-14.

Referring to FIGS. 16 and 17, differences between ALD TaN or CVD TaN, as compared to PVD TaN, can be shown in different ways. FIG. 16 provides a graph 500 that corresponds to the device 100 (FIG. 1), and a graph 510 that corresponds to the device 300 (FIG. 2-14). The graph 510 shows a N/Ta ratio of an ALD TaN to be about 2.3 to 2.6, a N/Ta ratio of a PVD TaN to be about 0.3 to 0.6, and a N/Ta ratio of an ALD TaN/PVD Ta or an ALD Ta/PVD TaN/Ta to be about 0.6 to 1.0. The carbon (C) content in a PVD TaN/Ta (graph 500) is lower than about 0.2%, and the C content in an ALD TaN/PVD Ta or an ALD TaN/PVD TaN/Ta (graph 510) is about 0.2 to 1%.

Referring to FIG. 17, an x-ray diffraction (XRD) analysis comparing the devices 100 and 300. A line 520 corresponds to the device 300, and a line 530 corresponds to the device 100. The lines 520, 530 are similar, except in the areas specifically designated in the figure. The figure shows a β-Ta in a PVD TaN/Ta (device 100) and an α-Ta in ALD TaN/PVD Ta or in ALD TaN/PVD TaN/Ta (device 300).

Figure 18:
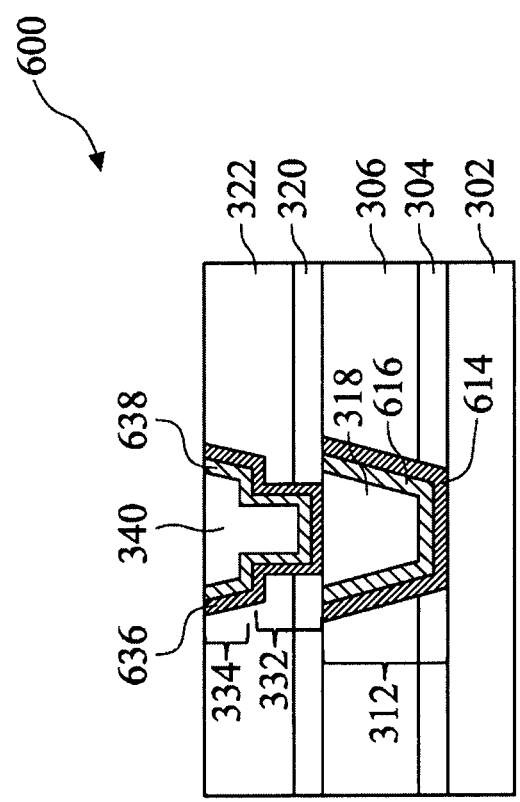
FIG. 18 is a cross sectional view of a device according to one or more embodiments of the present disclosure.

Referring to FIG. 18, shown therein is a device 600 fabricated according to various aspects of the present disclosure. Many layers and compositions of the device 600 are similar to those of the device 300 (FIG. 14). Therefore they are labeled with the same reference numerals for the purpose of simplicity. However, the device 600 includes a pair of metal barrier layers that is a Ta layer over a TaN layer, which is different from the device 300. In an embodiment, barrier layer 636 is a PVD TaN layer having a thickness in a range from about 10 Å to 20 Å, barrier layer 638 is a PVD Ta layer having a thickness in a range from about 50 Å to about 100 Å, and the barrier layer 638 is over the barrier layer 636. In another embodiment, barrier layer 614 is a PVD TaN layer having a thickness in a range from about 10 Å to about 20 Å, barrier layer 616 is a PVD Ta layer having a thickness in a range from about 50 Å to 100 Å, and the barrier layer 616 is over the barrier layer 614. In various embodiments, the pair of barrier layers 636/638 may have the same compositions as or different compositions from the pair of barrier layers 614/616. For example, in an embodiment, the barrier layers 614/616 are PVD TaN/PVD Ta layers while the barrier layers 636 and 638 are substantially the same as the barrier layers 336 and 338 (FIG. 14) respectively. In another embodiment, the barrier layers 636/638 are PVD TaN/PVD Ta layers, while the barrier layers 614 and 616 are substantially the same as the barrier layers 314 and 316 (FIG. 14) respectively. In yet another embodiment, the barrier layers 614/616 are PVD TaN/PVD Ta layers and the barrier layers 636/638 are also PVD TaN/PVD Ta layers. In various embodiments, the pair of PVD TaN/PVD Ta layers of the device 600, such as the 614/616 pair or the 636/638 pair, have N/Ta concentration ratio similar to the device 300 as shown in the graph 510 (FIG. 16). For example, with respect to the device 600, the N/Ta ratio of the PVD TaN layer is about 2.3 to 2.6, and the N/Ta ratio of the PVD TaN/PVD Ta layers is about 0.6 to 1.0. However, the carbon (C) content of the pair of PVD TaN/PVD Ta layers of the device 600 is lower than that of the barrier layers of the device 300. In an embodiment, the carbon (C) content in the PVD TaN/Ta layers of the device 600 is lower than about 0.2%.

In various embodiments, the device 600 is also different from the device 100 (FIG. 1). For example, the PVD TaN layer of the device 600 (e.g., the barrier layer 614 and/or the barrier layer 636) is thinner than the PVD TaN layer of the device 100 (e.g., the barrier layers 110, 120 and/or 126 in FIG. 1). In various embodiments, the PVD TaN layer of the device 600 is thinner than 30 Å, while the PVD TaN layer of the device 100 is thicker than 30 Å. Another difference between the device 600 and the device 100 is the N/Ta ratio in the respective PVD TaN/PVD Ta barrier layers. In various embodiments, the PVD TaN layer of the device 600 has a N/Ta ratio about 2.3 to 2.6 (the graph 510 of FIG. 16), while the PVD TaN layer of the device 100 has a N/Ta ratio about 0.3 to 0.6 (the graph 500 of FIG. 16).

Still referring to FIG. 18, in an embodiment of the device 600, the first trench 312 and the second trench 334 each have a CD (e.g., width) ranging from about 0.036 micron (µm) to about 1.0 µm, while the via 332 has a CD (e.g., diameter) ranging from about 0.025 µm to about 0.040 µm. In another embodiment of the device 600, the first trench 312 and the second trench 334 each have a CD (e.g., width) ranging from about 0.045 µm to about 1.0 µm, while the via 332 has a CD (e.g., diameter) ranging from about 0.040 µm to about 0.055

μm. In yet another embodiment of the device 600, the first trench 312 and the second trench 334 each have a CD (e.g., width) ranging from about 0.064 μm to about 1.0 μm, while the via 332 has a CD (e.g., diameter) ranging from about 0.055 μm to about 0.070 μm.

The device 600 may be fabricated with the method 200 (FIG. 2) in accordance with some embodiments. In an embodiment, the method 200 forms the barrier layers 614 and 616 as a pair of PVD TaN and PVD Ta layers in the step 210. To further this embodiment, the step 210 deposits the barrier layer 614 on the bottom and the side walls of the first trench 312 as shown in FIG. 6 using a first PVD process that includes plasma sputtering a Ta target with a controlled $N_2$ flow. In the first PVD process, the $N_2$ flow is controlled to be from about 20 Standard Cubic Centimeters per Minute (sccm) to about 40 sccm. In an embodiment, the $N_2$ flow is about 30 sccm. In another embodiment, the $N_2$ flow is about 36 sccm. In yet another embodiment, the $N_2$ flow is from about 30 sccm to about 40 sccm. In various embodiments, the first PVD process further includes an Ar flow ranging from about 4 sccm to about 50 sccm, a DC power ranging from about 3 KW to about 15 KW, and an AC power ranging from about 75 W to about 250 W. In various embodiments, the thickness of the PVD TaN layer 614 is controlled to be about 10 Å to 20 Å. Due to the high $N_2$ flow in combination with the other operation conditions (such as the Ar flow, DC power, and AC power), the PVD TaN layer 614 attains a high N to Ta ratio ranging from about 2.3 to about 2.6. The step 210 further includes depositing the barrier layer 616 on the barrier layer 614 using a second PVD process. The second PVD process includes plasma sputtering a Ta target without a $N_2$ flow. In various embodiments, the thickness of the PVD Ta layer 616 is controlled to be about 50 Å to 100 Å. In an embodiment, the method 200 forms the barrier layers 636 and 638 as a pair of PVD TaN and PVD Ta layers in the step 224 using similar PVD processes discussed above. Due to the high N/Ta ratio in the PVD TaN layer 636 (or 614), the PVD Ta layer 638 (or 616) attains higher Ta purity than the PVD Ta layer in the device 100 (FIG. 1). Accordingly, the device 600 attains a lower Rc than the device 100. Furthermore, certain characteristics of the device 600 are comparable with or even better than the device 300, as will be discussed below.

Figure 19:
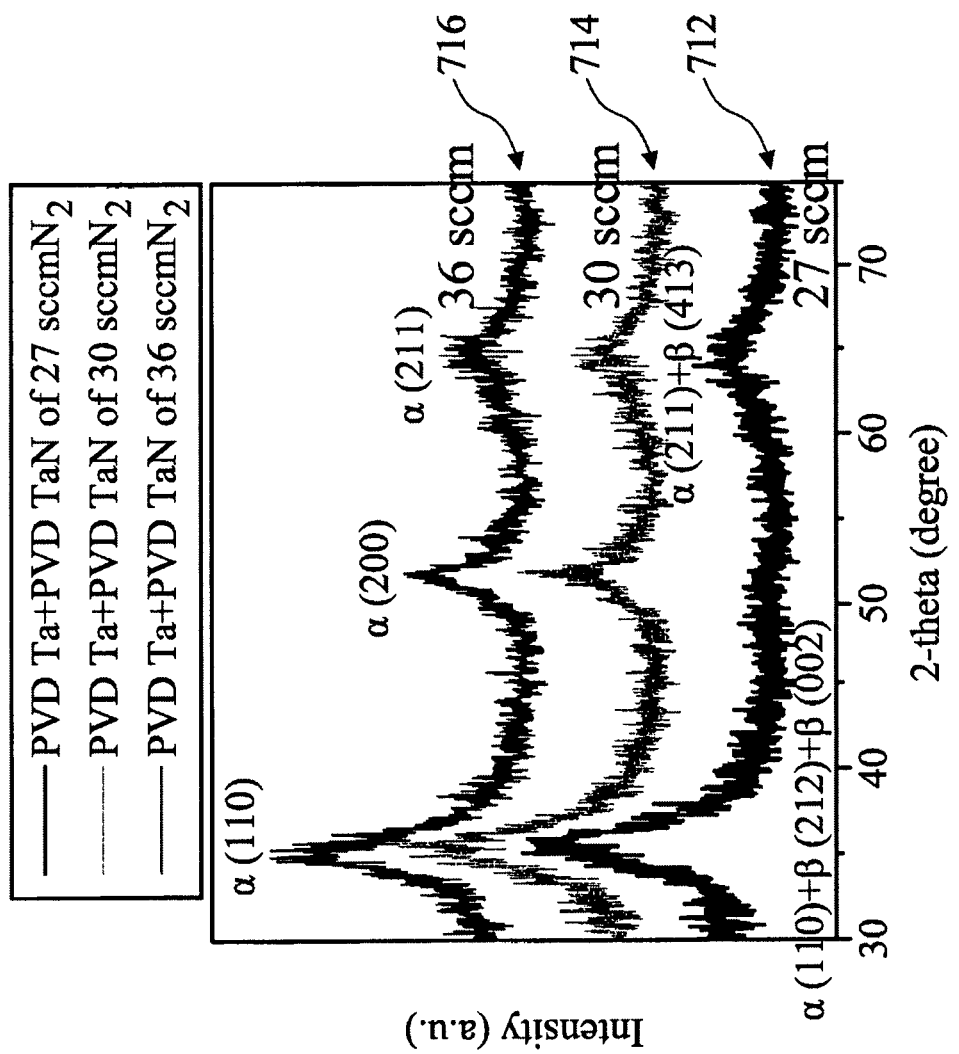
FIG. 19 is an X-ray diffraction (XRD) analysis of TaN/Ta compounds for the devices of FIG. 18, in accordance with some embodiments.

FIG. 19 shows an XRD analysis of various embodiments of the device 600. Referring to FIG. 19, a graph 712 shows Ta compositions in a pair of PVD TaN/PVD Ta layers wherein the PVD TaN layer is formed with an $N_2$ flow about 27 sccm. Similarly, graphs 714 and 716 show Ta compositions in such a pair but with different $N_2$ flows. Specifically, the embodiment in the graph 714 uses an $N_2$ flow about 30 sccm and the embodiment in the graph 716 uses an $N_2$ flow about 36 sccm. As can be seen from FIG. 19, the embodiment in the graph 712 includes both β-Ta and α-Ta while the embodiments in the graphs 714 and 716 include increased α-Ta component and decreased β-Ta component. Specifically, the embodiment in the graph 716 comprises α-Ta but substantially no β-Ta. Since β-Ta is generally more resistive than α-Ta, FIG. 19 at least partially explains why a PVD TaN layer formed with a higher $N_2$ flow contributes to a lower Rc of various embodiments of the device 600.

Figure 20:
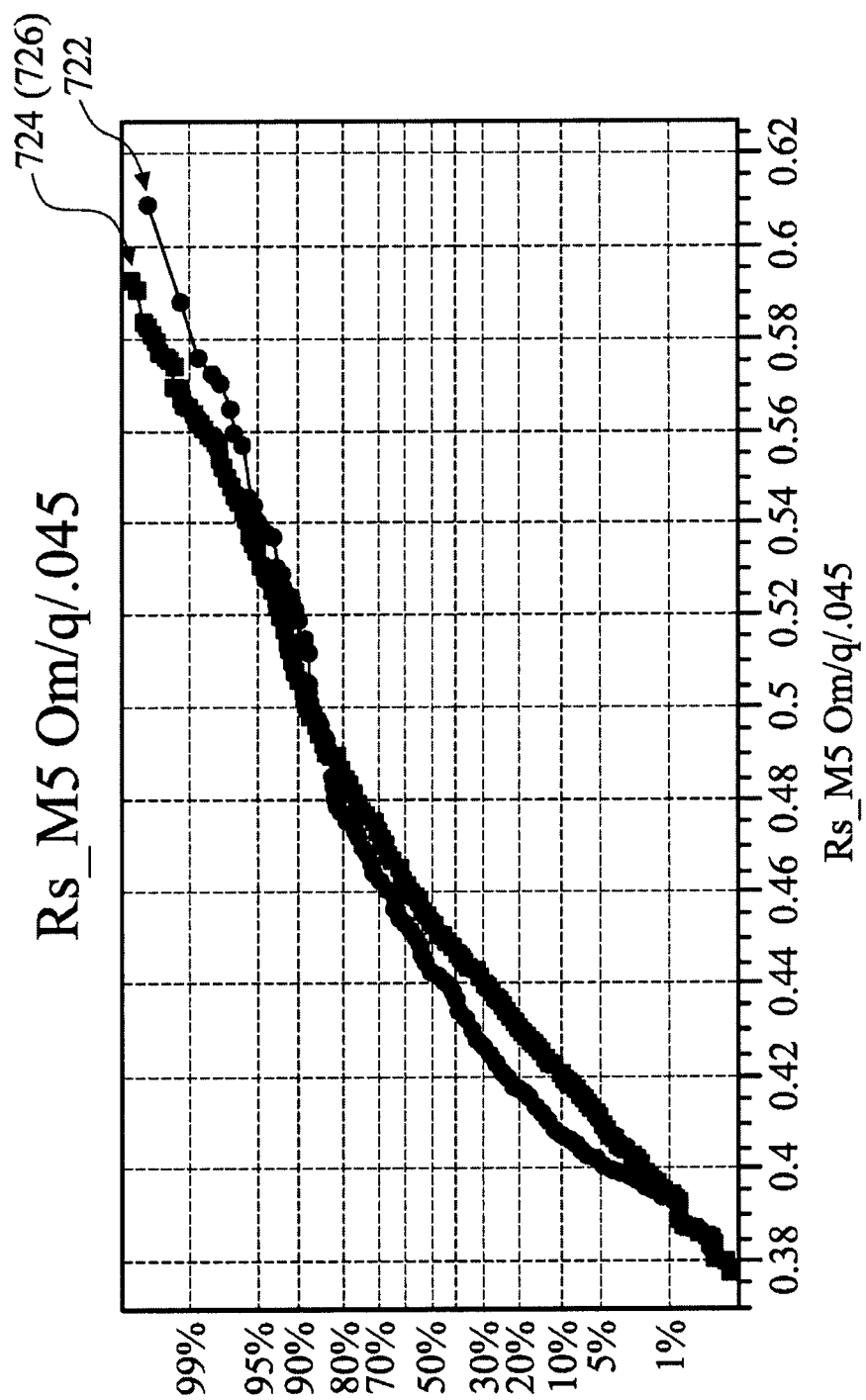
FIG. 20 shows graphs of sheet resistance of the devices of FIG. 14 and FIG. 18, in accordance with some embodiments.
Figure 21:
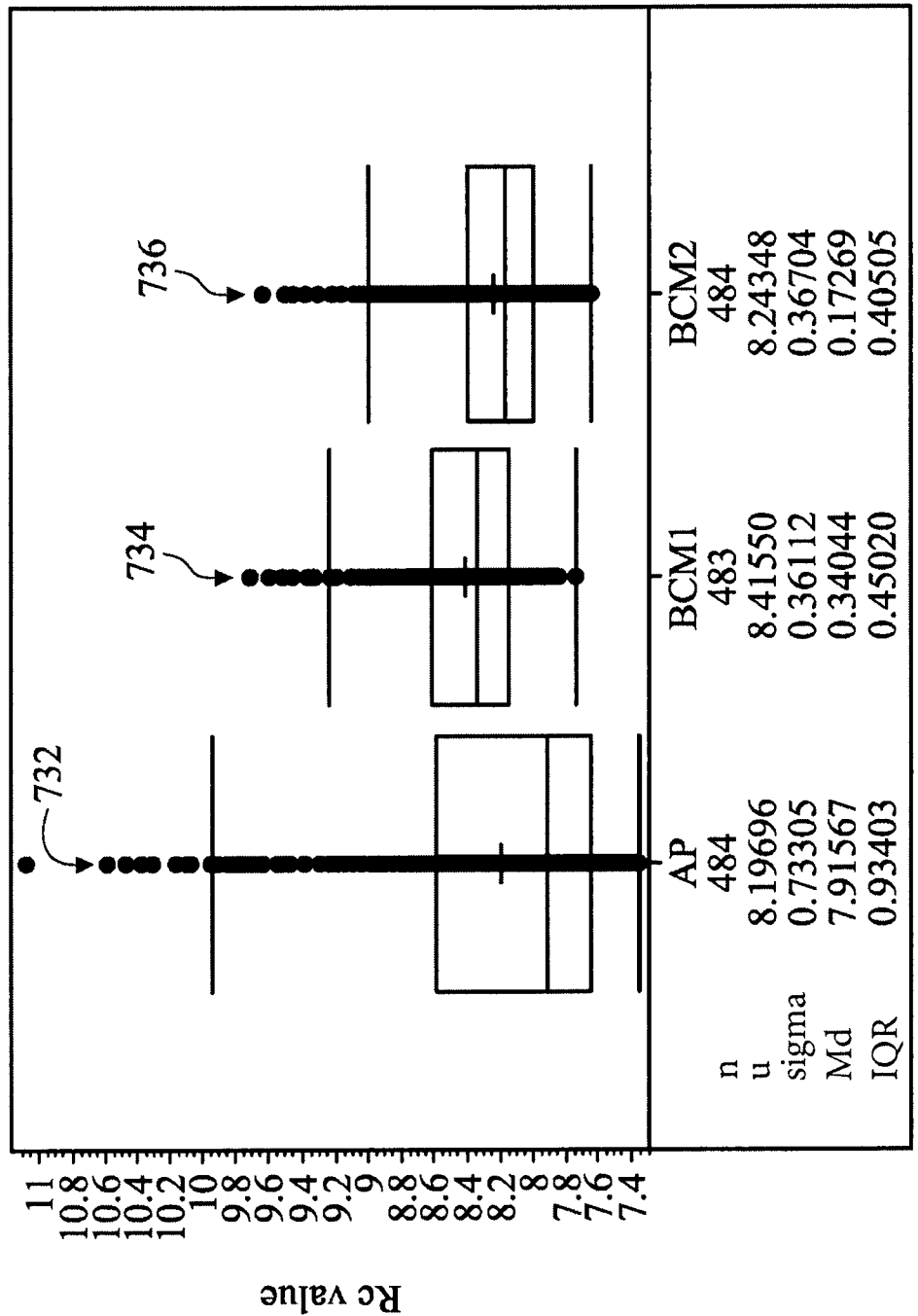

When designing an integrated circuit interconnect, such as the devices 100, 300, and 600, resistance of the interconnect is of important concern. For example, propagation delay t through an interconnect is generally expressed as t=RC where R is the resistance of the interconnect and C is the capacitive load of the interconnect. Therefore, a lower resistance generally contributes to a lower propagation delay, hence faster switching speed. Resistance of an interconnect includes a sheet resistance (Rs) component and a contact resistance (Rc) component. To compare the resistance of the devices 300 and 600, both the Rs and Rc components are respectively compared. To further this purpose, an embodiment of the device 300 and two embodiments of the device 600 are compared through simulations and experiments, wherein all three embodiments use a layer-5 Cu-containing metal line with a width 0.045 μm. The embodiment of the device 300 uses a PVD Ta layer (e.g., the barrier layer 338) over an ALD TaN layer (e.g., the barrier layer 336) as metal barrier layers in the via 332. The first embodiment of the device 600 uses a PVD Ta layer (e.g., the barrier layer 638) over a PVD TaN layer (e.g., the barrier layer 636) as metal barrier layers in the via 332 where the PVD TaN layer is formed with an $N_2$ flow about 30 sccm. The second embodiment of the device 600 uses a PVD Ta layer (e.g., the barrier layer 638) over a PVD TaN layer (e.g., the barrier layer 636) as metal barrier layers in the via 332 where the PVD TaN layer is formed with an $N_2$ flow about 36 sccm. FIG. 20 compares the Rs of the corresponding metal lines of the three embodiments. FIGS. 21 and 22 compare the Rc of the three embodiments.

Referring to FIG. 20, a graph 722 shows statistics about the Rs of the embodiment of the device 300. A graph 724 shows statistics about the Rs of the first embodiment of the device 600. Substantially overlapping the graph 724 is a graph 726 showing statistics about the Rs of the second embodiment of the device 600. As can be seen from FIG. 20, the Rs of the three embodiments are about the same.

Referring to FIGS. 21 and 22, graphs 732 and 742 show statistics about the Rc of the embodiment of the device 300, graphs 734 and 744 show statistics about the Rc of the first embodiment of the device 600, and graphs 736 and 746 show statistics about the Rc of the second embodiment of the device 600. In each of the graphs, about 484 samples are used. Referring to FIG. 21, the average and median Rc in the graph 732 are lower than those in the graphs 734 and 736. However, the Rc standard deviation (σ) in the graphs 734 and 736 are smaller than that in the graph 732, which contributes to more predictable interconnect resistance in the device 600. With respect to the two embodiments of the device 600 depicted in the graphs 734 and 736, the Rc standard deviation (σ) is less than about 0.4 Ohms (Ω). FIG. 22 shows the same information as in FIG. 21, but from a different perspective. Furthermore, compared with some embodiments of the device 100 (the group 402 in FIG. 15), the two embodiments of the device 600 demonstrate lower Rc generally, similar to the group 404 in FIG. 15 where the contact resistance (Rc) of the trench 312 to the trench 334 ranges from about 6 to about 11Ω while a critical dimension (CD) of the trenches ranges from about 0.05 to about 0.5 micrometer (μm).

The measurements and data shown above are for example purposes only, and are derived with respect to some, but not all, of the embodiments in the present disclosure. Accordingly, the present invention should not be limited by these measurements and data, apart from what is explicitly set forth in the claims.

Thus, the present disclosure describes a structure for an integrated circuit. The structure includes a substrate, a cap layer deposited on the substrate, a dielectric layer deposited on the cap layer, and a trench embedded in the dielectric layer. The trench includes an atomic layer deposition (ALD) TaN or a chemical vapor deposition (CVD) TaN deposited on a side wall of the trench in which a N/Ta ratio of the ALD TaN or the CVD TaN ranges from about 2.3-2.6, a physical vapor deposition (PVD) Ta or a combination of the PVD Ta and a PVD TaN deposited on the ALD TaN or CVD TaN in which a N/Ta ratio of the PVD TaN ranges from about 0.3 to 0.6 and a N/Ta ratio of the PVD Ta is near zero, and a Cu deposited on the PVD Ta or the combination of the PVD Ta and the PVD TaN deposited on the ALD TaN or the CVD TaN in which a N/Ta ratio of PVD Ta or the combination of the PVD Ta and the PVD TaN and the ALD TaN or the CVD TaN ranges from about 0.6 to 1.0. The structure further includes a via integrated into the trench at bottom of the filled trench. The via reaches to the cap layer. A thickness of the ALD TaN ranges from about 5 to 10 angstrom (A). A Ta of PVD Ta or the PVD TaN changes from β-Ta to α-Ta. The dielectric layer includes a low-k material with a dielectric constant k ranges from about 2.6 to 2.65. The dielectric layer further includes Si, C, O and H. A carbon (C) concentration in the ALD TaN and the PVD Ta or the PVD Ta and the PVD TaN deposited on the ALD TaN ranges from about 0.2 to 1 percent (%). A carbon (C) concentration in the PVD Ta or PVD TaN is less than about 0.2%.

In some embodiment, a structure for an integrated circuit is described. The structure includes a substrate, a first cap layer deposited on the substrate, a first dielectric layer deposited on the cap layer, a first trench embedded in the first dielectric layer, a second cap layer deposited on the first dielectric layer, a second dielectric layer deposited on the first dielectric layer, a second trench embedded in the second dielectric layer, a via located between the first trench and the second trench and integrated into the first trench at top of the filled first trench and into the second trench at bottom of the second trench. The first trench or the second trench includes an atomic layer deposition (ALD) TaN or a chemical vapor deposition (CVD) TaN deposited on bottom and side wall of the first trench, wherein a N/Ta ratio of the ALD TaN or the CVD TaN ranges from about 2.3-2.6, a physical vapor deposition (PVD) Ta or a combination of the PVD Ta and a PVD TaN deposited on the ALD TaN or CVD TaN, wherein a N/Ta ratio of the PVD TaN ranges from about 0.3 to 0.6 and a N/Ta ratio of the PVD Ta is near zero, and a Cu deposited on the PVD Ta or the combination of the PVD Ta and the PVD TaN deposited on the ALD TaN or the CVD TaN, where in a N/Ta ratio of PVD Ta or the combination of the PVD Ta and the PVD TaN and the ALD TaN or the CVD TaN ranges from about 0.6 to 1.0.

The present disclosure also describes a method of for fabricating an integrated circuit. The method includes depositing a cap layer on a substrate, depositing a dielectric layer on the cap layer, depositing a hard mask layer on the dielectric layer, forming a trench in the first dielectric layer, and filling the trench. Filling the trench includes depositing a first barrier layer on bottom and side walls of the trench, depositing a second barrier layer on the first barrier layer, and depositing a metal on the second barrier layer. The method further includes using a chemical mechanical polishing (CMP) to remove the hard mask layer. Depositing the first barrier layer includes depositing a tantalum nitride (TaN) layer with a thickness ranges from about 5 to 10 angstrom (Å) using an atomic layer deposition (ALD) process or a chemical vapor deposition process (CVD). Depositing the second barrier layer includes depositing a Ta layer with a thickness ranges from about 50 to 100 Å on the first barrier layer using a physical vapor deposition (PVD) process. Depositing the second barrier layer further includes depositing a TaN layer using a PVD process. Depositing the metal includes depositing copper (Cu). Depositing the metal further includes depositing a Cu seed layer.

In one exemplary aspect, the present disclosure is directed to a structure for an integrated circuit. The structure includes a substrate; a cap layer deposited on the substrate; a dielectric layer deposited on the cap layer; and a trench embedded in the dielectric layer. The trench includes a TaN layer formed on a side wall of the trench, wherein the TaN layer has a greater concentration of nitrogen than tantalum; a Ta layer formed over the TaN layer; and a Cu-containing layer formed over the Ta layer. An overall carbon (C) concentration of the TaN layer and the Ta layer is lower than about 0.2 percent (%).

In another exemplary aspect, the present disclosure is directed to a structure for an integrated circuit. The structure includes a substrate; a first cap layer formed over the substrate; a first dielectric layer formed over the first cap layer; a first trench embedded in the first dielectric layer. The first trench includes a first TaN layer deposited on bottom and sidewalls of the first trench, wherein the first TaN layer has a greater concentration of nitrogen than tantalum; a first Ta layer deposited over the first TaN layer; and a first Cu-containing layer formed over the first Ta layer. The structure further includes a second cap layer formed over the first dielectric layer; a second dielectric layer formed over the first dielectric layer; a second trench embedded in the second dielectric layer. The second trench includes a second TaN layer deposited on bottom and sidewalls of the second trench, wherein the second TaN layer has a greater concentration of nitrogen than tantalum; a second Ta layer deposited over the second TaN layer; and a second Cu-containing layer formed over the second Ta layer. The structure further includes a via located between the first trench and the second trench, wherein the via is integrated into the first trench at a top portion of the first trench and integrated into the second trench at a bottom portion of the second trench.

In yet another exemplary aspect, the present disclosure is directed to a method of fabricating an integrated circuit. The method includes depositing a cap layer on a substrate; depositing a dielectric layer on the cap layer; forming a trench in the dielectric layer; and filling the trench. The step of filling the trench includes depositing a first barrier layer on bottom and sidewalls of the trench using physical vapor deposition (PVD) of TaN with an $N_2$ flow at least 20 Standard Cubic Centimeters per Minute (sccm); depositing a second barrier layer on the first barrier layer using PVD of Ta; and depositing a metal layer over the second barrier layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating an integrated circuit, the method comprising:
   depositing a cap layer on a substrate;
   depositing a dielectric layer on the cap layer;
   forming a trench in the dielectric layer;

depositing a tantalum nitride (TaN) layer on a sidewall of the trench such that the TaN layer has a greater concentration of nitrogen than tantalum;

depositing a tantalum (Ta) layer on the TaN layer using physical vapor deposition (PVD); and depositing a metal layer over the Ta layer, wherein an overall N/Ta ratio of the TaN and Ta layers ranges from about 0.6 to about 1.0.

2. The method of claim 1, wherein the TaN layer is deposited using atomic layer deposition (ALD), and an N/Ta ratio of the TaN layer ranges from about 2.3 to about 2.6.

3. The method of claim 1, wherein the depositing of the TaN layer includes plasma sputtering a Ta target with a nitrogen ($N_2$) flow of at least 20 Standard Cubic Centimeters per Minute (sccm).

4. The method of claim 1, wherein the TaN layer is deposited to have a thickness ranging from about 5 to about 10 angstrom (Å).

5. The method of claim 1, wherein the Ta layer is deposited to have a thickness ranging from about 50 to about 100 Å.

6. The method of claim 1, wherein the metal layer includes copper.

7. The method of claim 1, wherein the TaN layer is deposited using physical vapor deposition (PVD).

8. A method of fabricating an integrated circuit, the method comprising:

depositing a cap layer on a substrate;

depositing a dielectric layer on the cap layer;

forming a trench in the dielectric layer;

depositing a tantalum nitride (TaN) layer on a side wall of the trench using physical vapor deposition (PVD) such that the TaN layer has a greater concentration of nitrogen than tantalum;

depositing a tantalum (Ta) layer on the TaN layer using PVD; and depositing a metal layer over the Ta layer, wherein an overall carbon (C) concentration of the TaN and Ta layers is lower than about 0.2 percent (%).

9. The method of claim 8, wherein the depositing of the TaN layer includes plasma sputtering a Ta target with a nitrogen ($N_2$) flow of at least 20 Standard Cubic Centimeters per Minute (sccm).

10. The method of claim 9, wherein the $N_2$ flow ranges from about 20 sccm to about 40 sccm.

11. The method of claim 9, wherein the depositing of the TaN layer further includes an argon (Ar) flow ranging from about 4 sccm to about 50 sccm, a DC power ranging from about 3 kW to about 15 kW, and an AC power ranging from about 75 W to about 250 W.

12. The method of claim 8, wherein the TaN layer is deposited to have a thickness ranging from about 10 to about 20 angstrom (Å).

13. The method of claim 8, wherein the Ta layer is deposited to have a thickness ranging from about 50 to about 100 Å.

14. The method of claim 8, wherein the metal layer includes copper.

15. The method of claim 8, wherein an overall N/Ta ratio of the TaN layer and the Ta layer ranges from 0.6 to 1.0.

16. A method of fabricating an integrated circuit, the method comprising:

depositing a cap layer on a substrate;

depositing a dielectric layer on the cap layer;

forming a trench in the dielectric layer;

depositing a first tantalum nitride (TaN) layer on a side wall of the trench using atomic layer deposition (ALD) such that the first TaN layer has a greater concentration of nitrogen than tantalum;

depositing a tantalum (Ta) layer on the first TaN layer using physical vapor deposition (PVD); and depositing a copper-containing metal layer over the Ta layer, wherein an overall N/Ta ratio of the first TaN layer and the Ta layer ranges from 0.6 to 1.0.

17. The method of claim 16, wherein an N/Ta ratio of the first TaN layer ranges from about 2.3 to about 2.6.

18. The method of claim 16, wherein the first TaN layer is deposited to have a thickness ranging from about 5 to about 10 angstrom (Å), and the Ta layer is deposited to have a thickness ranging from about 50 to about 100 Å.

19. The method of claim 16, further comprising:

depositing a second TaN layer between the first TaN layer and the Ta layer using PVD.

20. The method of claim 16, wherein an overall carbon (C) concentration of the TaN and Ta layers is about 0.2 percent (%) to 1%.

* * * * *